United States Patent
Gernhoefer et al.

(10) Patent No.: US 7,865,848 B2
(45) Date of Patent: Jan. 4, 2011

(54) LAYOUT OPTIMIZATION USING PARAMETERIZED CELLS

(75) Inventors: Veit Gernhoefer, Holzgerlingen (DE); Michael S. Gray, Fairfax, VT (US); Matthew T. Guzowski, Essex Junction, VT (US); Jason D. Hibbeler, Williston, VT (US); Stephen L. Runyon, Pflugerville, VT (US); Robert F. Walker, St. George, VT (US); Bruce C. Wheeler, Hingesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 677 days.

(21) Appl. No.: 11/846,017

(22) Filed: Aug. 28, 2007

(65) Prior Publication Data

US 2009/0064061 A1    Mar. 5, 2009

(51) Int. Cl.
*G06F 17/50*    (2006.01)
(52) U.S. Cl. ............................................. 716/2; 716/18
(58) Field of Classification Search ....................... 716/1, 716/2, 18
See application file for complete search history.

(56) References Cited

U.S. PATENT DOCUMENTS 5,802,349 A * 9/1998 Rigg et al. ..................... 716/2
7,007,258 B2 * 2/2006 Li ................................. 716/9

* cited by examiner

*Primary Examiner*—Jack Chiang
*Assistant Examiner*—Binh C Tat
(74) *Attorney, Agent, or Firm*—Gibb I.P. Law Firm, LLC; Richard M. Kotulak, Esq.

(57) ABSTRACT

A method of layout optimization containing parameterized cells includes reading a physical design containing parameterized cells, creating a new version for each of usage of a given parameterized cell. The method optimizes physical design shapes of each new version of the parameterized cell by assigning variables to parameters of the parameterized cell according to a desired objective. Then, the method updates the parameters of each new version of the parameterized cell and replaces each new version of the parameterized cell with an instance of the parameterized cell having updated parameters. The method can optionally adjust physical design shapes based on constraints related to the parameters.

2 Claims, 2 Drawing Sheets

LAYOUT OPTIMIZATION USING PARAMETERIZED CELLS

BACKGROUND AND SUMMARY

The embodiments of the invention generally relate to Cadence parameterized cells that allow programmatic control over schematic and layout attributes in a very large scale integration (VLSI) circuit design.

One process known as Cadence parameterized cells ("p-cells") is a useful technique for generating circuit designs based on a set of inputs. Logic cells in the p-cells design methodology are essentially routines that are called by the programs that create or modify layouts. The parameters that define a cell in such a library include gate widths, number of fingers, etc. A typical use of such p-cells is to couple the schematic and physical views of a cell, so that the routines that create cells in the schematic for a circuit also create the drawing shapes that correspond to the parameter settings for each instance of a cell.

In addition, the OpenAccess data format has adopted the concept of parameterized cells and includes a parameterized via cell as part of its definition. By parameterizing different characteristics of the logic cells, an effectively infinite number of combinations of cells is possible for a given placement. In this way, automated tools can then optimize across this set of combinations to reduce power or increase frequency, with very low overhead in supporting the shared circuit library when compared to the otherwise near-infinite variety of cell personalizations that might be needed in a full-custom design.

The recent introduction of via cells having many non-schematic parameters that correlate with physical manufacturing sensitivity has presented a new capability: optimizing p-cells at the shapes level for the purpose of yield improvement. There is currently no automated solution available for optimizing yield in this way.

In some cases of integrated circuit design representation and automation, there is a one-to-one correspondence between schematic parameters and layout parameters (e.g., device dimensions). In other cases—such as via overlaps—there is no aspect of the schematic that represents a particular geometric configuration of layout shapes.

This disclosure presents a method of layout optimization containing parameterized cells that includes reading a physical design containing parameterized cells and creating a new version for each of usage of a given parameterized cell. The method optimizes physical design shapes of each new version of the parameterized cell by assigning variables to parameters of the parameterized cell according to a desired objective. Then, the method updates the parameters of each new version of the parameterized cell and replaces each new version of the parameterized cell with an instance of the parameterized cell having updated parameters. The method can optionally adjust physical design shapes based on constraints related to the parameters. Such constraints can comprise balanced overlaps for OpenAccess vias.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
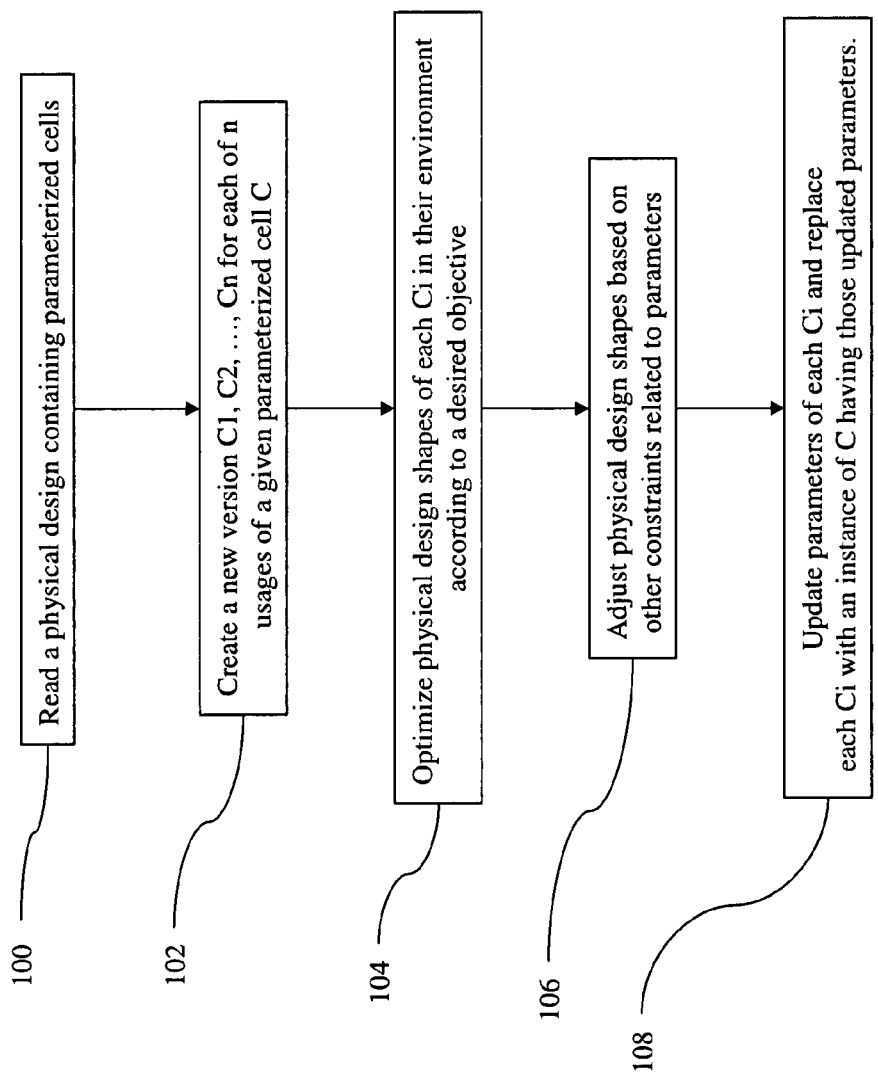
FIG. 1 is a flow diagram illustrating a method embodiment of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, Cadence parameterized cells allow programmatic control over schematic and layout attributes in a VLSI circuit. Small changes to these non-schematic layout values can have a significant effect on manufacturing yield. Traditional yield-based layout optimization modifies shapes by adjusting the edge positions of the drawn polygons in the layout in the following way:

(1) optimization variables are assigned to edges;
(2) mathematical constraints are constructed that correspond to geometric constraints between edges (for ground rules and connectivity);
(3) mathematical objectives are formed to represent the yield objective for which we are modifying the layout;
(4) the mathematical optimization problem is solved; and
(5) edge locations are updated based on the new values of the edge variables.

The invention uses the framework of mathematical optimization to set edge positions by modifying the parameter values in p-cells. We build constraints and objectives in the same way as above, but instead assign variables to the parameters. The update after optimization then sets parameter values in the p-cells and so results in optimized shapes at the point when the p-cell is invoked to create layout objects.

One step in enabling the modification of parameterized cells using the optimizer is for the optimization program to have a mapping of parameter values to edge positions for each parameterized cell comprising how the values of the parameters relate to edge positions of the shapes in that cell.

For simplicity, assume that this mapping is encoded in source code. In other words, the set of possible parameterized cells is known ahead of time, and the optimization program has information about how to react to each kind of cell. In the five-step layout-optimization framework described above, the parameter-to-edge mapping is used in steps (1) and (5). Instead of updating edge positions, we instead update parameter values based on edge positions and mappings. When necessary, additional passes of the optimizer are used after step (4) to set variables to permitted values (e.g., even integer values for via overlaps).

More specifically, as shown in FIG. 1, this invention presents a method of layout optimization containing parameterized cells. In item 100, the method performs a process of reading a physical design containing parameterized cells. Then, in item 102, the method creates a new version C1, C2, ..., Cn for each of n usages of a given parameterized cell C. The method optimizes physical design shapes of each Ci in their environment according to a desired objective in item 104. Also, in item 106, the method can optionally adjust physical design shapes based on other constraints related to parameters (such as balanced overlaps required for OpenAccess vias). In item 108, the method updates parameters of each Ci and replaces each Ci with an instance of C having those updated parameters.

Figure 2:
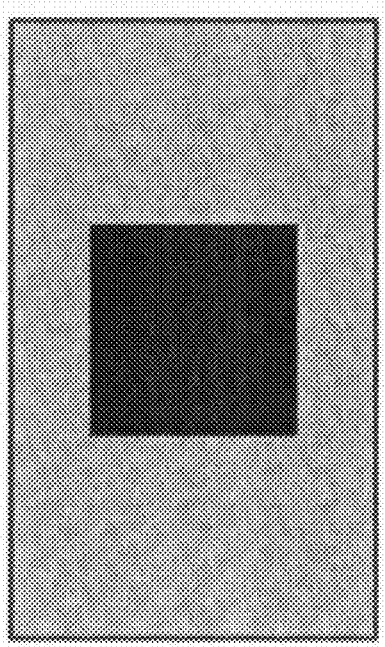
FIG. 2 is a via to which parameter values of a parameterized cell correspond.
Figure 3:
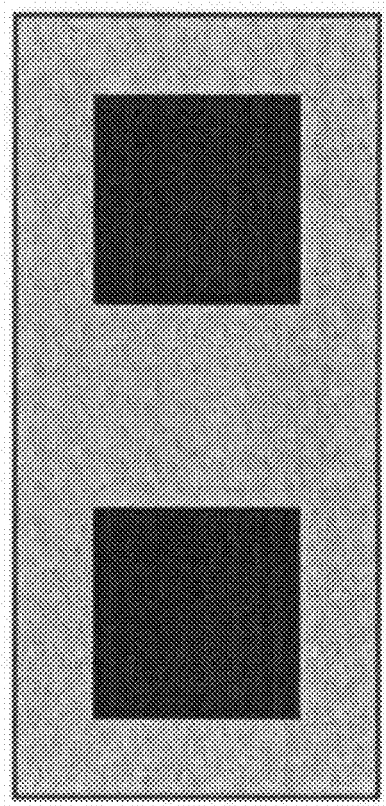
FIG. 3 is a via to which parameter values of a parameterized cell correspond.

FIG. 2 illustrates a parameterized via cell 200 having the following parameter values: #vias, north_south_overlap, east_west_overlap. One set of parameter values that will correspond to this via are: #vias=1, north_south_overlap=4, east_west_overlap=10. To the contrary, in the feature 300 shown in FIG. 3, one set of parameter values that will correspond to this via 300 are #vias=2, north_south_overlap=4, east_west_overlap=4.

The programmatic control over cell instances in a layout according to this invention enables efficient customization of VLSI layouts. Aspects that can be optimized include: power, yield, and frequency. By keeping a single cell definition having programmable parameters, data volume is controlled. Personalization is achieved by setting different parameters values for each usage of the base cell, but still only a single cell definition is required.

Tuners modify parameters corresponding to device dimension. This modification is done at the schematic level. The current invention modifies parameterized cells at the physical level. In many cases there is no schematic-level feature that corresponds to a change in the physical design, e.g., via overlaps.

For each type of parameterized cell, we construct a correspondence table. This is a mapping from edge location to parameter value. For simplicity, this table can be hard-coded for a particular application. The table allows us to update parameter values based on edge positions. One point of the invention is the link between a layout optimizer and the physical representation of parameterized cells.

The embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of embodiments, those skilled in the art will recognize that the embodiments of the invention can be practiced with modification within the spirit and scope of the appended claims.

What is claimed is:

1. A method of layout optimization containing parameterized cells, comprising:

reading a physical design containing parameterized cells using a computerized device;

creating a new version for each of usage of a given parameterized cell using said computerized device;

optimizing physical design shapes of each new version of said parameterized cell according to a desired objective using said computerized device;

updating parameters of each new version of said parameterized cell and replacing each said new version of said parameterized cell with an instance of said parameterized cell having updated parameters using said computerized device; and adjusting physical design shapes based on constraints related to said parameters using said computerized devices, wherein said constraints comprise balanced overlaps for parameterized vias.

2. A method of layout optimization containing parameterized cells, comprising:

reading a physical design containing parameterized cells using a computerized device;

creating a new version for each of usage of a given parameterized cell using said computerized device;

optimizing physical design shapes of each new version of said parameterized cell by assigning variables to parameters of said parameterized cell according to a desired objective using said computerized device;

updating said parameters of each new version of said parameterized cell and replacing each said new version of said parameterized cell with an instance of said parameterized cell having updated parameters using said computerized device; and adjusting physical design shapes based on constraints related to said parameters using said computerized device, wherein said constraints comprise balanced overlaps for parameterized vias.

* * * * *